United States Patent
Herzer et al.

(10) Patent No.: US 7,626,441 B2
(45) Date of Patent: Dec. 1, 2009

(54) DRIVE CIRCUIT WITH BOT LEVEL SHIFTER FOR TRANSMITTING AN INPUT SIGNAL AND ASSIGNED METHOD

(75) Inventors: Reinhard Herzer, Llmenau (DE); Matthias Rossberg, Llmenau (DE); Bastlan Vogler, Llmenau (DE)

(73) Assignee: SEMIKRON Elektronik GmbH & Co. KG, Nürnberg (DE)

( * ) Notice: Subject to any disclaimer, the term of this patent is extended or adjusted under 35 U.S.C. 154(b) by 29 days.

(21) Appl. No.: 11/978,268

(22) Filed: Oct. 29, 2007

(65) Prior Publication Data
US 2008/0136488 A1 Jun. 12, 2008

(30) Foreign Application Priority Data
Oct. 28, 2006 (DE) .................. 10 2006 050 913

(51) Int. Cl.
*H03L 5/00* (2006.01)
(52) U.S. Cl. .................. 327/333; 327/108; 327/109; 327/110; 327/111; 327/112
(58) Field of Classification Search ................ 327/112, 327/333
See application file for complete search history.

(56) References Cited

U.S. PATENT DOCUMENTS 6,323,704 B1 * 11/2001 Pelley et al. ................. 327/112
6,586,974 B1 * 7/2003 Humphrey et al. .......... 327/108

FOREIGN PATENT DOCUMENTS

DE 101 52 930 10/2002

* cited by examiner

*Primary Examiner*—Lincoln Donovan
*Assistant Examiner*—John W Poos
(74) *Attorney, Agent, or Firm*—Cohen Pontani Lieberman & Pavane LLP

(57) ABSTRACT

A drive circuit in power electronic systems comprising a half-bridge circuit of two power switches, a first so-called TOP switch and a second so-called BOT switch, which are arranged in a series circuit. The drive circuit has a BOT level shifter for transmitting an input signal from a drive logic to a BOT driver. The BOT level shifter is formed as an arrangement of an UP and a DOWN level shifter branch and a signal evaluation circuit connected downstream thereof. In the inventive method for transmitting the input signal, the signal evaluation circuit transfers an output signal to the BOT driver at least one of the UP and DOWN level shifter branches outputs a signal to the respectively assigned input of the signal evaluation circuit.

7 Claims, 3 Drawing Sheets

DRIVE CIRCUIT WITH BOT LEVEL SHIFTER FOR TRANSMITTING AN INPUT SIGNAL AND ASSIGNED METHOD

BACKGROUND OF THE INVENTION

1. Field of the Invention

The invention is directed to a drive circuit, and a method for transmitting an input signal thereto, and more particularly to a drive circuit having a level shifter for transmitting an input signal from a drive logic to a driver.

2. Description of the Related Art

Drive circuits of the type to which this invention is directed are employed in power electronic systems to drive power semiconductor switches arranged as individual switches or in a bridge circuit. Bridge circuits of this type are known as single-, two-, or three-phase bridge circuits, wherein the single-phase so-called half-bridge constitutes a basic element of a multiplicity of power electronic circuits. In a half-bridge circuit, two power switches, a first so-called TOP switch and a second so-called BOT switch, are arranged in a series circuit.

A half-bridge of this type generally has a connection to a DC intermediate circuit. The output, typically the AC voltage terminal of the half-bridge is usually connected to a load. The drive circuit generally comprises a plurality of partial circuits or functional blocks. The control signal is conditioned in a first partial circuit, the drive logic, and fed via further components to the driver circuits and finally to the control input of the respective power switch.

At relatively high intermediate circuit voltages, for example greater than 100 V, the drive logic is usually isolated from the driver circuits in terms of potential, since the associated power switches are at a differential potential and isolation of the voltages is therefore essential. This isolation applies at least to the TOP switch, but is also embodied at higher powers for the BOT switch on account of a possible chopping of the ground potential during switching. Such isolation can be realized for example by pulse transformers, by optocouplers or optical waveguides (direct electrical isolation), or with the aid of integrated circuit technology in an HVIC (High Voltage Integrated Circuit). The latter variant is being used with increasing frequency on account of various advantages offered thereby, such as small dimensions, low price and long lifetime. At the same time, HVICs afford the possibility of integrating a high-voltage component with a breakdown voltage greater than or equal to the intermediate circuit voltage which can be used in circuits for signal level conversion, in so-called level shifters. A lateral high-voltage MOSFET is usually used for the latter.

The level shifter described is part of the drive circuit and preferably embodied as an integrated circuit arrangement. It serves for transmitting a signal from a circuit part having a defined reference potential to a circuit part having an occasionally higher or lower reference potential, or vice versa. Such an arrangement is required for the integrated and potential-isolated driving of power semiconductors.

Two basic isolation technologies are known for forming level shifters in the case of HVICs: "SOI" (Silicon On Insulator) technologies and pn-isolated technologies (junction isolation). SOI technology affords a dielectric isolation of components and component groups, but is currently available only up to a dielectric strength of 800 V. SOI substrate wafers are significantly more expensive than standard substrates, although the costs are offset by a series of technical advantages and also considerable process simplifications flowing from the dielectric isolation. In the case of pn-isolated technologies, the reverse voltage is taken up by a reverse-biased pn junction. This technology is currently available up to 1200 V. However, production is very complicated and therefore cost-intensive. Furthermore, there are technical problems, for example with leakage currents and latch-up effects, inter alia, at relatively high temperatures, such as, for example, more than 125° C. operating temperature, and also in the event of chopping of the ground potential during fast dynamic operations.

In integrated drive circuits, only the level shifter transmission of the drive signals from the drive logic to the TOP driver has been known heretofore according to the prior art. This is necessary since the TOP driver, in contrast to the BOT driver, is at an elevated reference potential in phases. According to the prior art, the signal transmission from the drive side to the TOP driver is effected by means of pulsed (dynamic) and differential transmission, that is to say that on the drive side switch-on and switch-off pulses are generated from the signal to be transmitted, said pulses being transmitted to the TOP driver via the respective level shifter. This increases the transmission reliability and reduces the power demand of the circuit. Various integrated level shifter topologies are known. The simplest topology comprises an HV transistor having a corresponding blocking capability and a resistor, which are connected in series with one another. If a signal is passed to the gate of the HV transistor, the latter switches on. The shunt current thereby generated through the level shifter causes a voltage drop across the resistor, which can be detected as a signal by an evaluation circuit.

DE 101 52 930 A1 discloses an extended level shifter topology in which the drive signal is transmitted progressively, by means of n known level shifters connected in identically cascaded fashion, via n−1 intermediate potentials. It is thus possible to use transistors which have only the n-th portion of the required blocking capability of the entire level shifter. If transistors having the required blocking capability are available, the blocking capability of the level shifter can be increased by the factor n.

DE 10 2006 037 336, not previously published, discloses a level shifter embodied as a series circuit comprising n HV transistors connected in series. This topology has the advantages that the power consumption and circuitry outlay are reduced by comparison with DE 101 52 930 A1. This results in a smaller space requirement and therefore also lower costs.

What is common to all the known topologies is that, in the case of complementary construction of the level shifter, a signal transmission from a circuit part having a high reference potential to a signal part having a low reference potential is also possible. This property can be utilized for signal transmission back from the TOP driver to the drive logic.

According to the prior art, in integrated drive circuits, the drive logic (primary side) and the BOT driver (secondary side) are put at an identical reference potential or reference potentials deviating from one another only by a few volts, such that no signal transmission via level shifters is necessary. In this case, the terminals for the primary-side and secondary-side reference potential are usually short-circuited externally. Due to module- and system-internal inductances, for example line inductances, however, severe chopping of the reference potential of the BOT drivers in a positive or negative direction can occur during the switching of the power components. This occurs to a particularly great extent in medium- and high-power systems in which large currents, for example greater than 50 A, are switched. In this case, the potential difference can assume values that exceed the reverse voltage of the gate oxides of the transistors used, for example greater than 20 V. Junction isolation technologies have the disadvantage that the triggering of parasitic thyristor structures, so-called latch-up, can occur in the event of a corresponding chopping of the reference potential in the negative direction. This leads to loss of function and possibly to destruction of the affected components. This limitation is not manifested in SOI technologies, due to the dielectric isolation of the components.

There is therefore a need in the art for an improved drive circuit, and method for using it.

SUMMARY OF THE INVENTION

It is therefore an object of the invention to provide a drive circuit, preferably in the form of an at least partly monolithically integrated circuit, wherein a signal transmission between circuit parts whose reference potential difference lies above the dielectric strength of the gate oxides of the transistors used is possible.

The invention provides a drive circuit with a level shifter for the preferably unidirectional transmission of a signal from a first circuit part having a first reference potential to a second circuit part having a second potential. According to the invention, the drive circuit is developed by a BOT level shifter for the potential-isolating transmission of said input signal. The BOT level shifter itself is formed as an arrangement of two independently operating transmission branches, the UP and the DOWN level shifter branch, and a signal evaluation circuit connected downstream.

According to the invention, the UP level shifter branch transmits the input signal present from the primary side to the secondary side if the secondary-side reference potential is greater than or equal to the primary-side reference potential. The DOWN level shifter branch transmits the input signal present from the primary side to the secondary side if the secondary-side reference potential is less than or equal to the primary-side reference potential. Consequently, at least one valid signal is transmitted both in the case of higher and in the case of lower secondary-side reference potential relative to the primary-side reference potential. The signal evaluation circuit detects the signals of the respective output of the UP and DOWN level shifter branch and reconstructs the transmitted signal on the secondary side.

Preferably, the signal transmission at the level shifter according to the invention is effected in static fashion, that is to say that the signal to be transmitted is transmitted continuously from the primary side to the secondary side, and, on the other hand, in a manner free of shunt currents in the static state, that is to say that a shunt current flows through a level shifter branch momentarily only during a state change. This transmission constitutes an advantage with respect to the pulsed transmission according to the prior art since a complicated generation of transmission pulses is not required and the time period during which a shunt current flows can be reduced. Consequently, the power consumption and the circuitry outlay can be reduced by comparison with the prior art. This results in a smaller space requirement and therefore also a lower cost requirement. The continuous transmission of the signal furthermore results in a higher interference immunity since it is possible to dispense with a pulse edge storage device (flip-flop) on the secondary side.

Furthermore, it is possible to use the drive circuit, in comparison with the prior art, also in higher-power systems with greater potential differences between the primary side and the secondary side or the BOT power switch of the secondary side.

The method according to the invention for transmitting an input signal from the drive logic to a BOT driver within a drive circuit with BOT level shifter is characterized in that the signal evaluation circuit transfers an output signal to the BOT driver if either the UP or the DOWN or both level shifter branches output a signal to the respectively assigned input of the signal evaluation circuit.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings.

The inventive solution is explained in more detail with reference to FIGS. 1 to 4.

DETAILED DESCRIPTION OF THE PRESENTLY PREFERRED EMBODIMENTS

Figure 1:
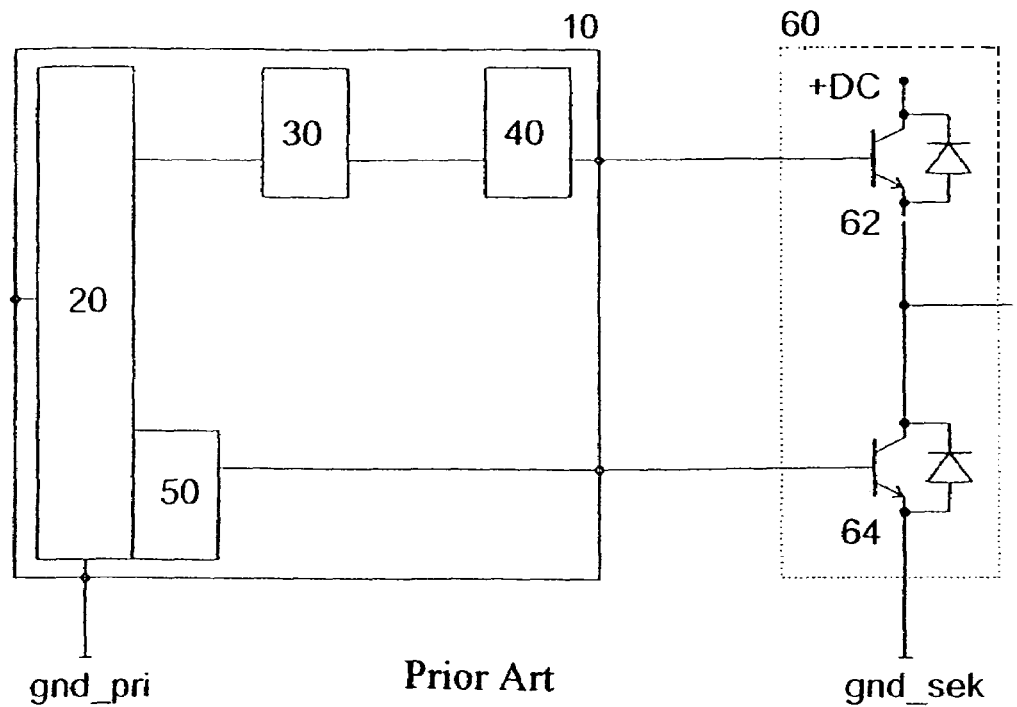
FIG. 1 shows a monolithically integrated drive circuit according to the prior art.

FIG. 1 shows a monolithically integrated drive circuit 10 according to the prior art with a half-bridge circuit 60. Half-bridge circuit 60 has, in accordance with the prior art, a BOT 62 and a TOP power switch 64, which here are in each case formed as an IGBT with diode reverse-connected in parallel. BOT switch 64 is at the reference potential (gnd_sek) of the secondary side, which, in applications having small line inductances, is virtually equal to the reference potential (gnd_pri) of the primary side. The reference potential (gnd_pri) of the primary side is the reference potential of the drive circuit 10.

Drive circuit 10 itself has a drive logic 20, a TOP level shifter 30 with TOP driver 40 connected downstream, and also a BOT driver 50. In this case, BOT driver 50 is at the reference potential of drive logic 20.

Figure 2:
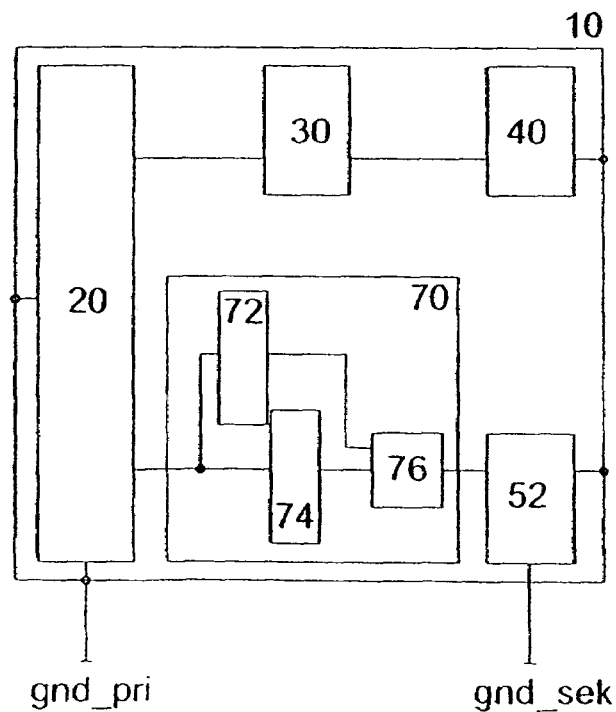
FIG. 2 shows a monolithically integrated drive circuit according to the invention with a BOT level shifter.

FIG. 2 shows a monolithically integrated drive circuit according to the invention with a BOT level shifter 70. The latter forms the development according to the invention of the prior art in accordance with FIG. 1. The BOT switch 64 (FIG. 1) is at the reference potential (gnd_sek) of the secondary side, which, in applications having large line inductances, is different from the reference potential (gnd_pri) of the primary side in phases. The BOT level shifter 70 in this case comprises an UP level shifter branch 72, a DOWN level shifter branch 74 and a signal evaluation circuit 76 connected downstream of said branches, which is also at the reference potential (gnd_sek) of the secondary side. The output of the signal evaluation circuit 76 is connected to the input of BOT driver 52.

Figure 3:
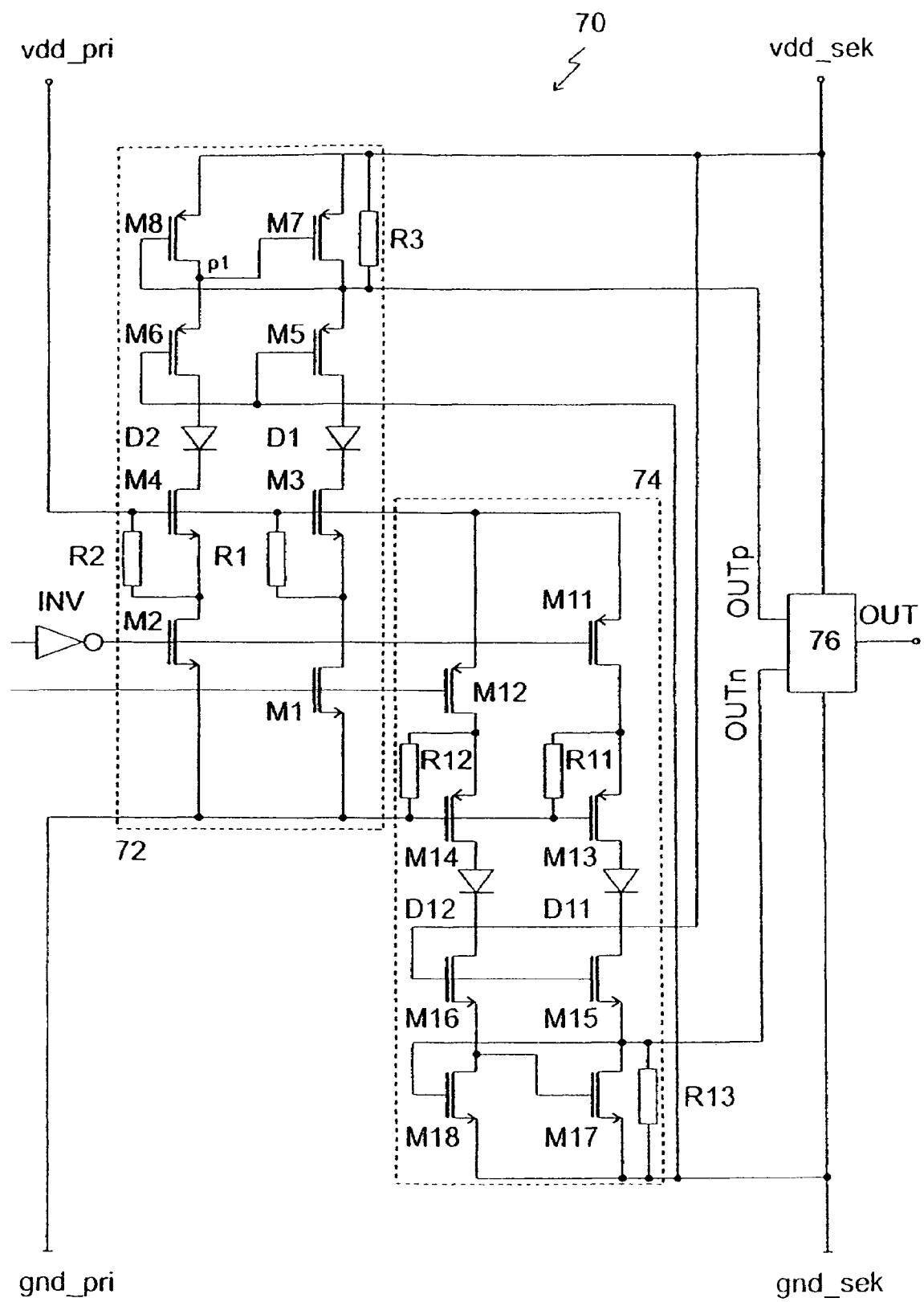
FIG. 3 shows a BOT level shifter of a drive circuit according to the invention.
Figure 4:
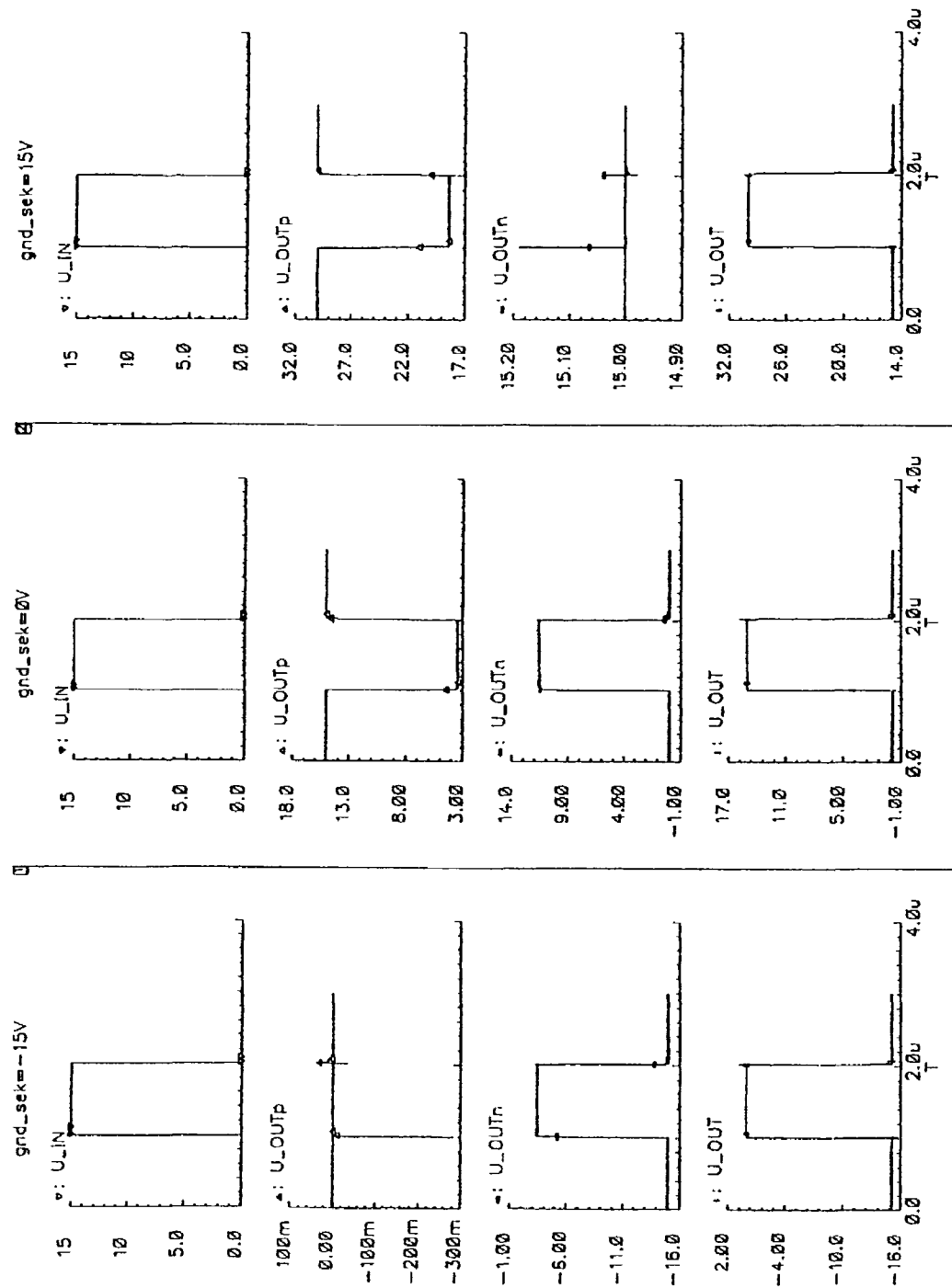
FIG. 4 shows simulation results of the method according to the invention.

FIG. 3 shows a BOT level shifter 70 of a drive circuit according to the invention in detail. In this respect, FIG. 4 shows the simulation results of the method according to the invention.

In this case, BOT level shifter 70 has two symmetrical parts, the UP 72 and DOWN 74 level shifter branches. These are, in principle, identical in construction and functioning, although respectively complementary transistors are used, that is to say that n-channel transistors in the UP level shifter branch are embodied by p-channel transistors in the DOWN level shifter branch, and vice versa. Terminals which are connected to a supply voltage in the UP level shifter branch 72 are connected to the corresponding reference potential in the DOWN level shifter branch 74, and vice versa. The construction of the UP and DOWN level shifter branches is explained below.

The UP level shifter branch, for its part, comprises two identical partial branches having switching transistors M1 and respectively M2, a transistor M3 and respectively M4 in each case of the n-channel type, a diode D1 and respectively D2, and also the further transistors M5 and respectively M6 and M7 and respectively M8 in each case of the p-channel type. These components of the respective partial branch are connected in series. The source terminals of switching transistors M1 and M2 are connected to the primary-side reference potential (gnd_pri). The gate terminals of M3 and M4 are connected to the primary-side supply voltage terminal (vdd_pri). The source terminals of M7 and M8 are connected to the secondary-side supply voltage terminal (vdd_sek) and the gate terminals of M5 and M6 are connected to the secondary-side reference potential (gnd_sek). The gate terminals of M7 and M8 are connected to the drain of M8 and M7, respectively, that is to say to the drain of the transistor of the parallel branch (cross-coupling). The drain of M7 forms the output (OUTp) of the UP level shifter branch 72 and is connected to a first input of signal evaluation circuit 76.

Analogously, each partial branch of DOWN level shifter branch 74 comprises a switching transistor M11 and respectively M12, and a transistor M13 and respectively M14 in each case of the p-channel type, a diode D11 and respectively D12, and also transistors M15 and respectively M16 and M17 and respectively M18 in each case of the n-channel type. These components of the respective partial branch are also connected in series. The source terminals of the switching transistors M11 and M12 are connected to the primary-side supply voltage terminal (vdd_pri). The gate terminals of M13 and M14 are connected to the primary-side reference potential (gnd_pri). The source terminals of M17 and M18 are connected to the secondary-side reference potential (gnd_sek) and the gate terminals of M15 and M16 are connected to the secondary-side supply voltage terminal (vdd_sek). The gate terminals of M17 and M18 are connected to the drain of M18 and M17, respectively, that is to say to the drain of the transistor of the parallel branch (cross-coupling). The drain of M17 forms the output (OUTn) of the DOWN level shifter branch 74 and is connected to a second input of the signal evaluation circuit 76.

The functioning of the UP level shifter branch 72 is described below for the case where the secondary-side reference potential (gnd_sek) is virtually identical to or greater than the primary-side reference potential (gnd_pri). For the DOWN level shifter branch 74, the described statements hold true in the same way for opposite polarity. A control signal (IN) conditioned by the drive logic, for example a rectangular pulse, is passed to the gate of the switching transistor M1. The invert of that signal, which is generated by the inverter (INV), is passed to the gate of the switching transistor M2. The control signals bring about an exclusive switching on of a respective one of transistors M1 and M2. When M1 is switched on, the transistor M3 is likewise opened (cascade principle).

Diode D1 is forward-biased. At this point in time, the drain potential of the transistor M7 is close to the secondary-side supply voltage (vdd_sek), since the gate-source voltage of M7 is more negative (greater in magnitude) than its threshold voltage and the transistor is therefore conducting (on). This is due to the fact that at this point in time, in the second partial branch M2, M4, M6, M8 and D2, transistors M2, M4 and M6 are conducting (on) and transistor M8 is not conducting (off). Therefore, node p1 (gate potential of M7) is close to the secondary-side reference potential (gnd_sek). It follows from this that M5 also has a gate-source voltage which is less than the threshold voltage. Consequently, M5 is also conductive (on).

A shunt current builds up in the partial branch M1, M3, M5, M7 and D1. The potential at the output (OUTp) of the UP level shifter branch 72 decreases as a result. Consequently, the gate-source voltage of M8 is also reduced. If its gate-source voltage falls below the threshold voltage, then M8 becomes conductive (on) and the potential at the node p1 rises, which in turn has the effect that the gate-source voltage of M7 rises until it becomes more positive than the threshold voltage and M7 starts to block (off). The potential at the output node OUTp thus also decreases further.

As a result of the cross-coupling of transistors M7 and M8, the two partial branches act as described as a multivibrator. As a result of the positive feedback of the two partial branches, the switching time of the stage, that is to say the time period during which appreciable switching currents can flow, becomes very short. This results in a low power consumption of the level shifter.

The minimum potential at the output (OUTp) and at the node (p1) is established in the on state in static fashion in such a way that the threshold voltage of transistors M5 and M6 is approximately reached. As a result, it is only during the switching over that a shunt current flows through the respectively switching on partial branch. Otherwise, the blocking (switched-off) transistors M5 and M6 prevent a further current flow in the switched-on level shifter branch. Consequently, the entire UP level shifter branch 72 operates statically in a manner free of shunt currents.

Since the gate terminals of M5 and M6 are at the secondary-side reference potential (gnd_sek) and the lowest potentials at the output OUTp and at the node p1 are limited to a value which lies in the region of (gnd_sek) minus the threshold voltage of M5 and M6, respectively, the permissible gate-source voltage of the transistors M7 and M8 cannot be exceeded if the secondary-side operating voltage, i.e. the potential difference (vdd_sek minus gnd_sek), does not exceed the magnitude of the permissible gate-source voltage. In all the further transistors, too, the magnitudes of the gate-source voltage do not exceed the respective primary-side (vdd_pri) and secondary-side (vdd_sek) operating voltage. Consequently, even large voltage differences which can occur between the reference potentials of the primary side and the secondary side do not result in a loading of the gate oxides of the transistors used. For the DOWN level shifter branch, the statements hold true analogously for a reference potential (gnd_sek) of the secondary side which is lower than the reference potential (gnd_pri) of the primary side.

The maximum permissible difference between primary-side and secondary-side reference potential is given by the drain-source dielectric strength of transistors M3 to M6. In order to overcome potential differences which are in the region of the operating voltage, for example 15V, it is often possible to use low-voltage transistors for M3 to M6. Medium-voltage or high-voltage transistors are employed for higher voltages. For the DOWN level shifter branch, the statements hold true analogously for a reference potential (gnd_sek) of the secondary side which is lower than the reference potential (gnd_pri) of the primary side.

In order to ensure a defined switch-off signal (OUT) at the output of the level shifter 70 when a signal (IN) is not present at the input of the BOT level shifter 70, for example when the primary-side supply voltage (vdd_pri) is switched on or is absent, the pull-up resistor (R3) is connected between operating voltage (vdd_sek) of the secondary side and the output (OUTp). The high-value resistors (R1 and R2) are connected to the operating voltage terminal (vdd_pri) of the primary side and in each case to the source of transistors M3 and M4, respectively. Thus, given an undefined state of the primary side, transistors M3 and M4 are also switched off in a defined manner. The resistors R11, R12 and R13 perform the analogous function in DOWN level shifter branch 74.

The switching state at the output of UP level shifter branch 72 is detected by the signal evaluation circuit and evaluated together with the switching state at the output of DOWN level shifter branch 74. The output signal (OUT) generated is passed to BOT driver 52.

The signal transmission via UP level shifter branch 72 is effected only if the reference potential (gnd_sek) of the secondary side is higher than, equally as high as or slightly lower than the reference potential (gnd_pri) of the primary side. If the reference potential (gnd_sek) of the secondary side lies below a specific value, for example a few volts, relative to the primary side, then the predetermined switch-on threshold, which is predetermined in the signal evaluation circuit by a threshold value detection circuit, for example a comparator or Schmitt trigger, is not undershot. No switch-on signal is transmitted in this case. The voltage at the output (OUTp) then corresponds to the off state (LOW). If the potential of the secondary side decreases to an extent such that the drain-bulk diodes of the transistors M1 to M8 would be forward-biased, that is to say the secondary-side supply potential (vdd_sek) falls below the primary-side reference potential (gnd_pri), then diodes D1 and D2 block a current flow through both partial branches.

Analogously, the signal transmission via DOWN level shifter branch 74 is effected only if the reference potential (gnd_sek) of the secondary side is lower than, equally as high as or slightly higher than the reference potential (gnd_pri) of the primary side. If the reference potential (gnd_sek) of the secondary side lies above a specific value, for example a few volts, relative to the primary side, the predetermined switch-on threshold, which is predetermined in the signal evaluation circuit by a threshold value detection circuit, for example an EM comparator or Schmitt trigger, is not exceeded. No switch-on signal is transmitted in this case. The voltage (OUTn) at the output corresponds to the off state (HIGH). If the potential of the secondary side rises to an extent such that the drain-bulk diodes of the transistors M11 to M18 would be forward-biased, that is to say that the secondary-side reference potential (gnd_sek) rises above the potential of the primary-side supply voltage (vdd_pri), then diodes D11 and D12 block a current flow through both partial branches.

If the reference potential (gnd_sek) of the secondary side is within a range of a few volts above and below the reference potential (gnd_pri) of the primary side, then both the UP 72 and the DOWN 74 level shifter branch transmit valid signals from the primary side to the secondary side. This overlapping range ensures a reliable signal transmission even taking account of manufacturing variations of the transmission thresholds, due to technologically dictated fluctuations of component parameters, and also during fast changes in the secondary-side reference potential. This increases the interference immunity of level shifter 70.

Signal evaluation circuit 76 generates a valid drive signal (OUT) for BOT driver 52 if a signal is transmitted either via UP level shifter branch 72 or via DOWN level shifter branch 74 or via both level shifter branches simultaneously (OR combination).

FIG. 4 illustrates the transient transmission behaviour of level shifter 70 in accordance with FIG. 3 in the context of a simulation, for negative reference potential of the secondary side (gnd_sek=−15V, left), for identical reference potential of primary side and secondary side (gnd_sek=0 V, middle) and for positive reference potential of the secondary side (gnd_sek=15V, right). In this case, the reference potential (gnd_pri) of the primary side is always at ground potential (0 V). The same rectangular drive signal $U_{IN}$ in each case was passed to input IN. It can be seen from the illustration that, for identical reference potential of primary side and secondary side (middle), a transmitted signal appears both at the output of the UP level shifter branch ($U_{OUTp}$) and at the output of the DOWN level shifter branch ($U_{OUTn}$), whereas for negative and for positive reference potential, a transmitted signal appears only at the output of the respectively assigned level shifter branch and the output of the corresponding complementary level shifter branch remains in the off state. In all three cases, the signal evaluation circuit recognizes that at least one signal was transmitted via the UP and/or DOWN level shifter branch, and outputs a valid output signal $U_{OUT}$. The level shifter 70 thus exhibits the desired behavior.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed:

1. A drive circuit with a BOT level shifter for transmitting an input signal from a drive logic to a BOT driver, wherein the BOT level shifter comprises
    an UP level shifter branch;
    a DOWN level shifter branch; and
    a signal evaluation circuit connected downstream of said UP and DOWN level shifter branches;
    wherein said UP level shifter branch is formed from two partial branches, which are each formed from the series arrangement of two respective n-channel transistors (M1, M3 and M2, M4), wherein the input signal is present at M1 and the invert of the input signal is present at M2, a respective diode (D1 and D2) and two respective p-channel transistors (M5, M7 and M6, M8); and
    said DOWN level shifter branch is formed from two partial branches, which are each formed from the series arrangement of two respective p-channel transistors (M11, M13 and M12, M14), wherein the input signal is present at M12 and the invert of the input signal is present at M11, a respective diode (D11 and D12) and two respective n-channel transistors (M15, M17 and M16, M18).

2. The drive circuit of claim 1, further comprising a first multivibrator including the components (M1 to M8, D1, D2) in said UP level shifter branch is formed by the interconnection of transistors (M7, M8); and a second multivibrator including the components (M11 to M18, D11, D12) in said DOWN level shifter branch is formed by the interconnection of transistors (M17, M18).

3. The drive circuit of claim 1, wherein the gates of transistors (M5, M6) are connected to a reference potential of the BOT driver; and the gates of transistors (M15, M16) are connected to a supply potential of the BOT driver.

4. The drive circuit of claim 1, wherein a reference potential of the BOT driver is allowed to fluctuate around a reference potential of the drive logic up to the magnitude of the maximum possible dielectric strength of said UP and DOWN level shifter branch without a loss of function.

5. A method for transmitting an input signal from the drive logic to a BOT driver within a drive circuit having a BOT level shifter wherein the BOT level shifter comprises an UP level shifter branch;

a DOWN level shifter branch; and a signal evaluation circuit connected downstream of said UP and DOWN level shifter branches;

wherein the method comprises having said signal evaluation circuit transfer an output signal to the BOT driver if at least one of said UP and DOWN level shifter branches outputs a signal to a respectively assigned input of said signal evaluation circuit; and wherein said UP level shifter branch indicates a signal to the assigned input of said signal evaluation circuit if a secondary-side reference potential is no less than substantially equal to a primary-side reference potential, and said DOWN level shifter branch indicates a signal to the assigned input of said signal evaluation circuit if the secondary-side reference potential is no more than substantially equal to the primary-side reference potential.

6. The method of claim 5, wherein a shunt current flows in the event of a signal change through the partial branch of one of the UP and DOWN level shifter branches for a first period of time that is shorter than a second period of time during which the associated input signal is present.

7. The method of claim 5, wherein said UP level shifter branch is formed from two partial branches, which are each formed from the series arrangement of two respective n-channel transistors (M1, M3 and M2, M4), wherein the input signal is present at M1 and the invert of the input signal is present at M2, a respective diode (D1 and D2) and two respective p-channel transistors (M5, M7 and M6, M8); and said DOWN level shifter branch is formed from two partial branches, which are each formed from the series arrangement of two respective p-channel transistors (M11, M13 and M12, M14), wherein the input signal is present at M12 and the invert of the input signal is present at M11, a respective diode (D11 and D12) and two respective n-channel transistors (M15, M17 and M16, M18);

wherein the method further comprises the step of limiting the magnitudes of the gate-source voltages of transistors (M7, M8 and M17, M18), independently of the difference between the primary-side and secondary-side reference potential, to a voltage no more than substantially equal to the secondary-side operating voltage.

* * * * *